US006761059B2

(12) United States Patent
Hsia et al.

(10) Patent No.: US 6,761,059 B2
(45) Date of Patent: Jul. 13, 2004

(54) DIAGNOSTIC TOOL FOR ELECTRIC-OPERATED FUEL INJECTORS AND THEIR DRIVERS

(75) Inventors: David Hsia, Glendale Heights, IL (US); Radek Oleksiewicz, Riverwood, IL (US)

(73) Assignee: International Engine Intellectual Property Company, LLC, Warrenville, IL (US)

( * ) Notice: Subject to any disclaimer, the term of this patent is extended or adjusted under 35 U.S.C. 154(b) by 208 days.

(21) Appl. No.: 10/068,190

(22) Filed: Feb. 5, 2002

(65) Prior Publication Data

US 2003/0146762 A1 Aug. 7, 2003

(51) Int. Cl.[7] ........................ G01R 31/28; G01R 31/00

(52) U.S. Cl. .................................................... 73/119 A

(58) Field of Search ........................ 73/119 A; 123/381, 123/539, 506, 490, 359; 364/431.05, 431.01; 239/586.1; 324/511

(56) References Cited

U.S. PATENT DOCUMENTS 3,919,885 A * 11/1975 Kaireit .................... 73/119 A
4,811,710 A * 3/1989 Schmitt et al. ............. 123/359
5,020,362 A * 6/1991 Hart et al. ................ 73/119 A
6,367,719 B1 * 4/2002 Wright .................... 239/585.1
6,660,458 B2 * 12/2003 Lin ........................... 123/490

* cited by examiner

*Primary Examiner*—Edward Lefkowitz
*Assistant Examiner*—Octavia Davis
(74) *Attorney, Agent, or Firm*—Dennis Kelly Sullivan; Susan L. Lukasik; Jeffrey P. Calfa

(57) ABSTRACT

A diagnostic tool (10) for testing fuel injectors (50) and their driver circuits (IDM), including associated wiring harnesses, in a fuel injection system of an engine in a motor vehicle. The tool has a driver-connection port (16) for connection to the driver circuits and an injector-connection port (18) for connection to the fuel injectors via jumper wiring harnesses. The tool can perform 1) a fuel injector test, by connecting an ohmmeter to the tool to measure injector coil resistance, 2) a driver-injector test, by connecting an oscilloscope to the tool to observe traces of electric current waveforms applied to the fuel injector, 3) a driver circuit test, by connecting the respective driver circuit to a load that simulates the load imposed by the respective fuel injector, and 4) a cylinder contribution test, by selectively disconnecting certain fuel injector actuators from their driver circuits while leaving the remaining fuel injector actuators connected to their driver circuits.

21 Claims, 5 Drawing Sheets

DIAGNOSTIC TOOL FOR ELECTRIC-OPERATED FUEL INJECTORS AND THEIR DRIVERS

FIELD OF THE INVENTION

This invention relates generally to diagnostic tools for diagnosis of motor vehicle engines. More particularly, the invention relates to a diagnostic tool for diagnosing both electric-operated fuel injectors of an engine and the driver circuits that operate the fuel injectors.

BACKGROUND AND SUMMARY OF THE INVENTION

Certain motor vehicle engines have fuel injectors that inject fuel into the engine cylinders where the injected fuel forms a portion of a combustible mixture that is ignited to power the engine. Certain fuel injectors are electrically operated by a control that includes driver circuits through which electric current is delivered to operate the fuel injectors. In a diesel engine there is typically one fuel injector per cylinder. Each injector injects fuel directly into the respective cylinder at a proper time in the engine cycle.

When an engine fuel injection system is being serviced or diagnosed, an ability to test each individual fuel injector and its respective driver circuit may be useful. However, such comprehensive testing of certain engines may be difficult and/or inconvenient for one or more different reasons, such as accessing individual fuel injectors in an engine compartment and the individual driver circuits. Comprehensive testing often includes the need to connect various pieces of test equipment, like current probes, voltmeters, oscilloscopes, etc., to the engine electrical system that serves the fuel injectors. Making the proper connections of such equipment to various portions of the engine electrical system may require a significant amount of time because of difficulty and inconvenience in obtaining the desired access.

The present invention relates to a diagnostic tool for facilitating diagnostic testing of an engine fuel injection system by providing convenience in connecting certain pieces of test equipment to a portion of the engine electrical system that pertains to the fuel injectors and their driver circuits. The diagnostic tool itself contains certain test equipment, such as indicator lights, that is useful in diagnosis of the fuel injectors and their driver circuits.

A preferred embodiment of the inventive diagnostic tool comprises a portable enclosure that can be carried by hand. This enables the tool to be conveniently moved about in a service facility to diagnose a motor vehicle that has been brought into the facility for service. The tool has a front face containing various switches and indicator lights and indicia for correlating switch positions and indicator lights with particular fuel injectors and driver circuits. The tool also has various ports for establishing connection of various pieces of test equipment, like some of those mentioned above, with the engine electrical system. Two of the ports comprise multi-terminal connectors that enable the tool, in effect, to be transparently inserted between the driver circuits and the fuel injectors.

The tool insertion is accomplished by disconnecting mated multi-terminal connectors in the vehicle, connecting one of the disconnected connectors through one jumper wiring harness to one of the multi-terminal connectors of the tool, and connecting the other disconnected connector through another jumper wiring harness to the other multi-terminal connector of the tool. The use of jumper harnesses allows the tool to be placed in a convenient location remote from the engine where it can be readily observed and easily operated by service personnel. By providing separate jumper harnesses that can be connected to and disconnected from the tool, rather than harnesses that are permanently connected to the tool, it becomes possible for one tool to service vehicles whose electrical wiring between the fuel injectors and their driver circuits has different pin-outs in the mated connectors. Any particular pair of jumpers is configured to establish proper circuit connection of a particular pin-out of the particular vehicle connectors to the tool connectors.

It is believed that the diagnostic tool of the invention provides an effective solution for facilitating various aspects of fuel injection system diagnosis.

One general aspect of the invention relates to a diagnostic tool for testing fuel injectors and their driver circuits in a fuel injection system of an engine in a motor vehicle. The tool comprises a driver-connection port for connection to the driver circuits and an injector-connection port for connection to the fuel injectors. A load simulates that imposed by a fuel injector on a driver circuit. Individual position selector switches, each of which is individual to a particular fuel injector and the respective driver circuit, is selectively operable to first and second positions. In its first position, the position selector switch connects the simulated load through the driver-connection port to the respective driver circuit when the driver circuits have been disconnected in the vehicle from the fuel injectors and instead connected to the driver-connection port. In its second position, the position selector switch connects the respective driver circuit through the tool with the respective fuel injector when the driver circuits and the fuel injectors have been disconnected in the vehicle from each other, the driver circuits are instead connected to the driver-connection port, and the fuel injectors are instead connected to the injector-connection port.

Another general aspect of the invention relates to a diagnostic tool for testing a fuel injector and a respective driver circuit in a fuel injection system of an engine in a motor vehicle when the driver circuit and the fuel injector have been disconnected from each other in the vehicle and instead connected to the tool. The tool comprises a driver-connection port for connection of the driver circuit to the tool, an injector-connection port for connection of the fuel injector to the tool, and an electric current path through the tool for conducting electric current from the driver circuit to the fuel injector. A sensor senses magnetic flux created by flow of electric current through the current path and illuminates an indicator when the magnetic flux sensed by the sensor is indicative of the delivery of a particular electric current from the driver circuit to the fuel injector.

The sensor comprises an electronic circuit chip disposed proximate at least one turn of a conductor of the current path that effectively amplifies the density of magnetic flux that results from the flow of electric current through the current path, and the indicator comprises a light-emitting diode that is operated by the chip to illuminate when the magnetic flux acting on the sensor exceeds an amount that indicates the particular electric current flow from the driver circuit to the fuel injector.

Still another general aspect of the invention relates to a diagnostic tool for testing fuel injectors and driver circuits that operate the fuel injectors in a fuel injection system of an engine in a motor vehicle when the driver circuits and the fuel injectors have been disconnected from each other in the vehicle and instead connected to the tool. The comprises a driver-connection port for connection of the driver circuits to the tool, an injector-connection port for connection of the fuel injectors to the tool, and a respective electromagnetic sensor for sensing flow of electric current from each driver circuit through the tool to a respective fuel injector. The tool also has a first auxiliary-equipment-connection port for connecting an oscilloscope to the tool, an injector-selector switch for selectively connecting the electromagnetic sensors to the first auxiliary-equipment-connection port, a second auxiliary-equipment-connection port for connecting an oscilloscope to the tool, and an electromagnetic sensor connected to the second auxiliary-equipment-connection port for sensing flow of electric currents from multiple ones of the driver circuits to their respective fuel injectors.

Still another general aspect of the invention relates to a diagnostic tool for cylinder contribution testing of fuel injectors and their driver circuits in a fuel injection system of an engine in a motor vehicle when the driver circuits and the fuel injectors have been disconnected from each other in the vehicle and instead connected to the tool wherein the tool comprises a driver-connection port for connection of the driver circuits to the tool, an injector-connection port for connection of the fuel injectors to the tool, and switches that allow the driver circuits to be individually selectively connected and disconnected, through the tool, to and from the fuel injectors.

Another general aspect of the invention relates to a diagnostic tool for testing fuel injectors and their driver circuits in a fuel injection system of an engine in a motor vehicle when the driver circuits and the fuel injectors have been disconnected from each other in the vehicle and instead connected to the tool. The tool comprises a driver-connection port for connection of the driver circuits to the tool, an injector-connection port for connection of the fuel injectors to the tool, auxiliary-equipment-connection ports that allow connection of auxiliary test equipment to the tool, a load that simulates the load imposed by a fuel injector on a driver circuit, multiple indicators, and switches.

The switches allow the driver circuits to be selectively connected and disconnected, through the tool, to and from the fuel injectors. When disconnecting a driver circuit from a respective fuel injector, the switches connect that driver circuit to the simulated load to enable a driver circuit test to be performed with the result being indicated by one of the indicators. When disconnecting a driver circuit from a respective fuel injector, the switches connect a fuel injector to one of the auxiliary-equipment-connection ports to enable a fuel injector test to be performed via a piece of test equipment connected to that one auxiliary-equipment-connection ports. When connecting a driver circuit to a respective fuel injector, the switches enable a driver-injector test to be performed with the result being indicated by a respective indicator, and with a waveform of electric current flow from the driver circuit to the fuel injector being made available to another piece of test equipment connected to another of the auxiliary-equipment-connection ports.

Still another general aspect of the invention relates to a method for conducting diagnostic testing of fuel injectors and their driver circuits in a fuel injection system of an engine in a motor vehicle. The method comprises disconnecting mated connections between the driver circuits and the fuel injectors, connecting the driver circuits to a driver-connection port of the tool, connecting the fuel injectors to an injector-connection port of the tool, and then conducting at least one of three tests.

A fuel injector test, by connecting a piece of test equipment that measures an electrical characteristic of an electric actuator of a fuel injector to an auxiliary-equipment-connection port of the tool, and operating switches of the tool to disconnect the actuator of the fuel injector from the respective driver circuit and to instead connect the actuator to the auxiliary-equipment-connection port.

A driver-injector test, by connecting an oscilloscope to an additional auxiliary-equipment-connection port of the tool, and operating the switches of the tool to connect the fuel injector actuator to the respective driver circuit and to connect to the additional auxiliary-equipment-connection port, a sensor that senses the electric current flow from the respective driver circuit to the fuel injector actuator.

A driver circuit test, by operating the switches of the tool to disconnect the actuator of the fuel injector from the respective driver circuit and to instead connect the respective driver circuit to a load that simulates the load imposed by the respective fuel injector.

A cylinder contribution test, by operating the switches of the tool to connect each fuel injector actuator to its respective driver circuit, and then selectively operating the switches to selectively disconnect certain fuel injector actuators from their driver circuits while leaving the remaining fuel injector actuators connected to their driver circuits.

Diagnostic testing of electrical circuits in an engine fuel injection system can check both circuit devices and wiring connected with those devices.

The foregoing, along with further aspects, features, and advantages of the invention, will be seen in the following disclosure of a presently preferred embodiment of the invention depicting the best mode contemplated at this time for carrying out the invention. The disclosure includes drawings, briefly described as follows.

DESCRIPTION OF THE PREFERRED EMBODIMENT

Figure 1:
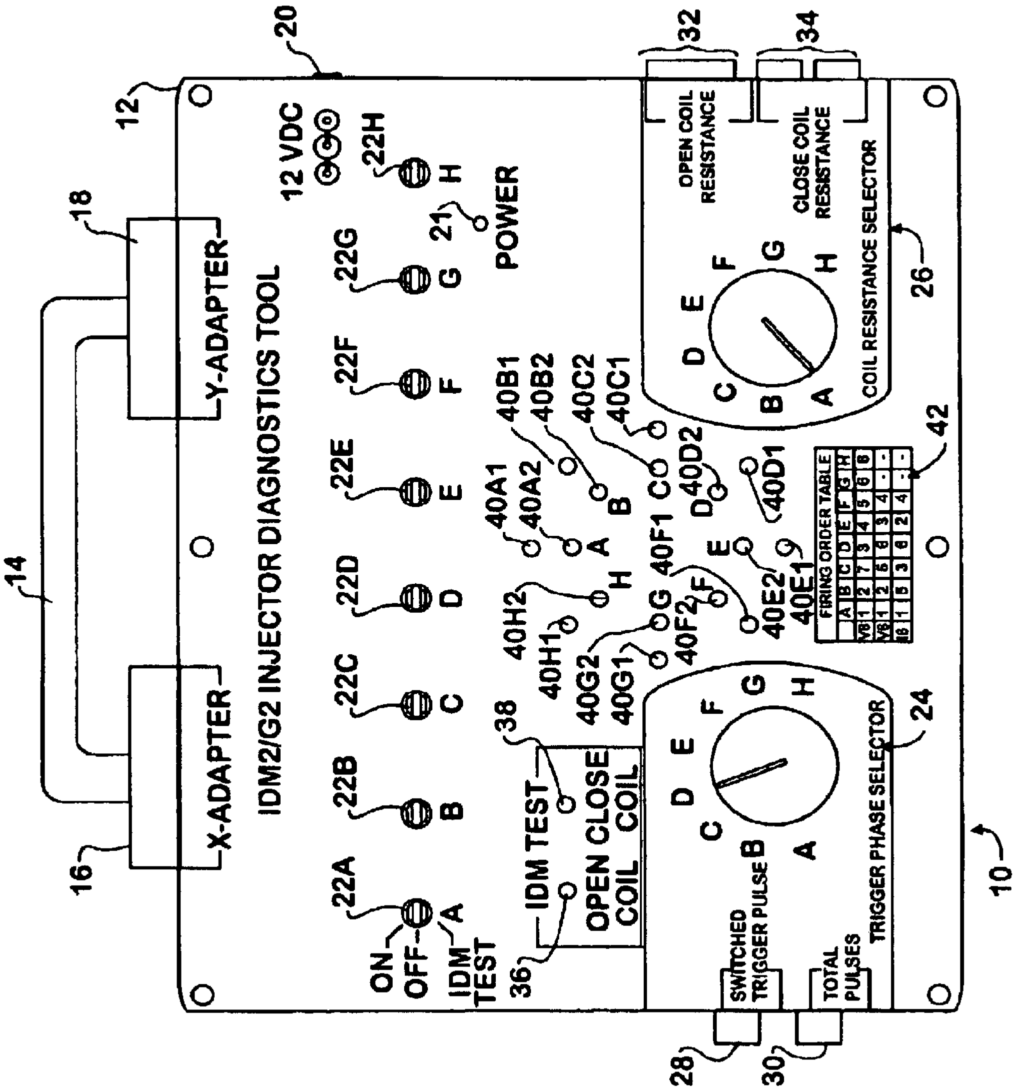
FIG. 1 is a front elevation view of a diagnostic tool embodying principles of the present invention.

FIG. 1 shows a portable diagnostic tool 10 that comprises a generally rectangular casing 12 having a handgrip 14 that allows the tool to be grasped by a person's hand and carried. Two multi-terminal electrical connectors 16 and 18 are mounted in the top wall of the casing to provide for the connection of tool 10 with electrical circuits of a fuel injection system of an engine in a motor vehicle.

Electric power for certain circuits and devices contained within casing 12 is delivered to the tool via a jack 20 in a sidewall of the casing. For the particular tool that is being described, 12 volt DC power is connected to jack 20 although the power source and its connection to the jack are not specifically shown. An indicator lamp 21, such as a light emitting diode (LED), is disposed on the front face of the casing and illuminates when 12 V power is being delivered to jack 20.

Arranged spaced apart in a horizontal row across the front face of casing 12 are eight position selector switches 22A, 22B, 22C, 22D, 22E, 22F, 22G, and 22H. Below that row of switches, and toward the left side of the casing's front face, is a rotary multi-position selector switch 24, sometimes referred to as a Trigger Pulse Selector. To the right of switch 24 is another rotary multi-position selector switch 26, sometimes referred to as a Coil Resistance Selector, or injector-selector switch.

Two ports 28, 30 are mounted in the left sidewall of casing 12 proximate, and in association with, selector switch 24. Two ports 32, 34 are mounted in the right sidewall of casing 12 proximate, and in association with, selector switch 26.

Two LED's 36, 38 are disposed in the casing's front face just above switch 24. At the center of the front face, between and offset slightly above switches 24, 26, is an arrayed cluster of sixteen LED's identified by the base numeral 40. The LED's are grouped into eight pairs, each pair lying on a respective imaginary radial from a common center of the cluster. The radials are uniformly spaced about the center at 45° intervals. The radially outer LED of each pair is designated by the suffix 1, and the radially inner LED, by the suffix 2. The radially outer LED's lie on a common imaginary outer circle while the radially inner ones lie on a common, but smaller, imaginary inner circle. Each pair is associated with a respective one of the position selector switches 22 by the same literal suffix. Hence, pair 40A1, 40A2 is associated with switch 22A; pair 40B1, 40B2 with switch 22B, etc.

A firing order table 42 is also presented on the front face of the casing directly below the LED cluster.

The particular tool 10 that is being described is intended for use with a fuel injection system whose fuel injectors are electrically operated by driver circuits from an injector driver module, or IDM. Each of these particular fuel injectors comprises two electric actuators each of which is operated by a respective driver circuit in the IDM. One actuator is sometimes referred to by the designation "open coil" while the other is sometimes referred to by the designation "close coil". Those respective designations appear below the respective LED's 36, 38 on the front casing face.

An example of a motor vehicle that has such a fuel injection system is a truck whose motor is a diesel engine. The IDM is under the control of an electronic engine control system. Electric current is delivered to the respective actuators by the respective driver circuits at proper times in the engine operating cycle to cause fuel to be injected in proper amounts directly into the engine cylinders. An injection is initiated by a respective driver circuit's actuation of one of the two actuators of a fuel injector and terminated by another driver circuit's actuation of the other actuator. Further detail of one example of such an injection system is described in U.S. Pat. No. 6,029,628.

In the vehicle, the IDM is electrically connected to the fuel injectors via a wiring harness that contains mated connectors. Tool 10 is connected for diagnostic testing of the IDM and the fuel injectors by disconnecting the mated connectors in the vehicle from each other and then connecting each with a respective one of connectors 16 and 18. Jumper wiring harnesses may be used to establish connection of the vehicle wiring harness to connectors 16 and 18. One of the two jumper harnesses is configured to connect the driver circuits of the IDM to connector 16, and the other harness is configured to connect the fuel injector actuators to connector 18. The use of such jumper harnesses allows tool 10 to be placed in a convenient location remote from the engine in the vehicle so that the front face of the tool can be readily seen and its switches conveniently operated by service personnel when in use. Moreover, the use of separate jumper harnesses that can be connected to and disconnected from the tool, rather than harnesses that are permanently connected to the tool, enable for one tool to service vehicles whose electrical wiring between the fuel injectors and their driver circuits has different pin-outs in the mated vehicle connectors. Any particular pair of jumper harnesses is configured to establish proper circuit connection of a particular pin-out of the particular vehicle connectors to the tool connectors 16, 18.

Figure 2:
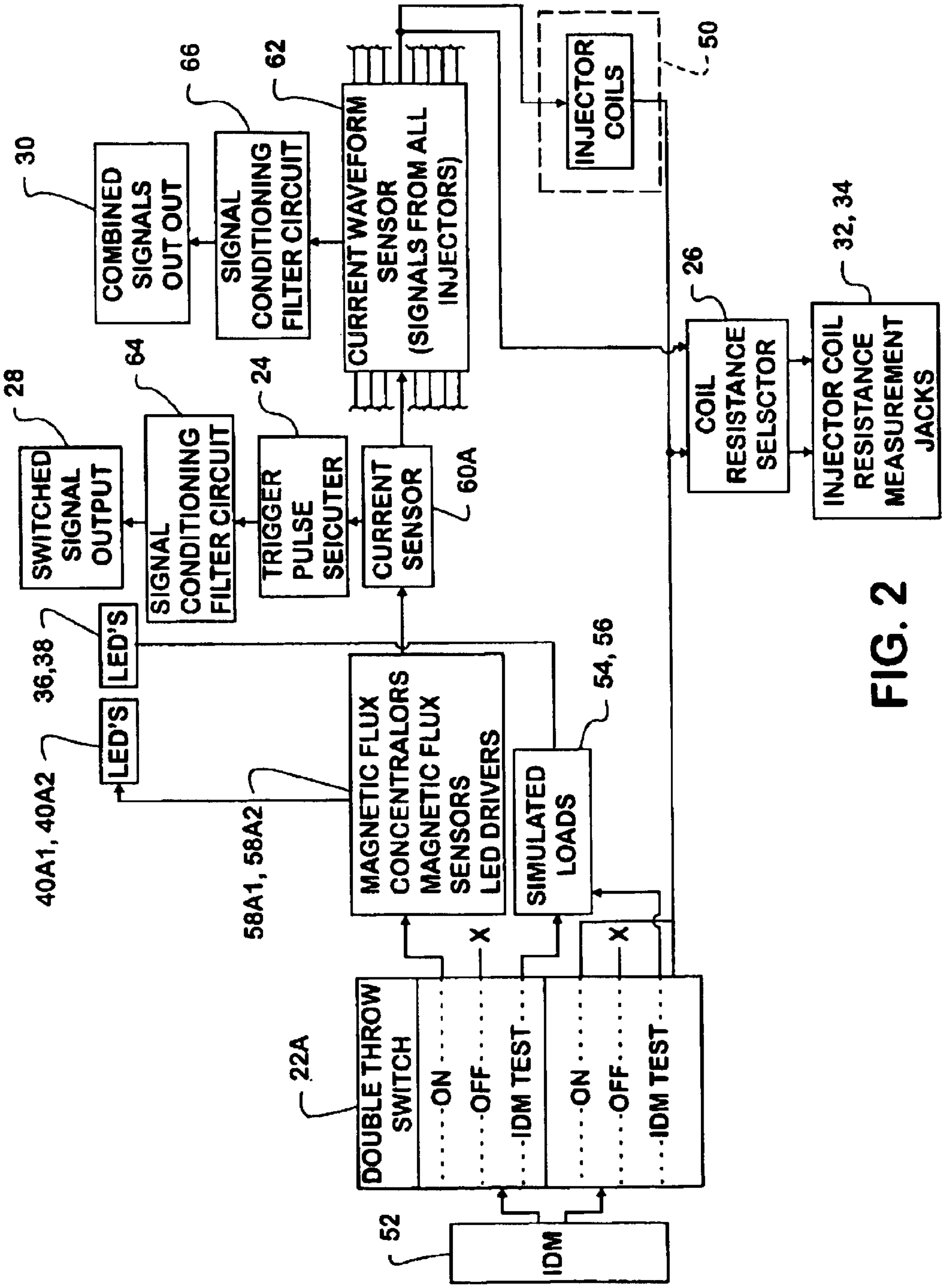
FIG. 2 is a general block diagram of the tool.

FIG. 2 shows detail of the organization and arrangement of tool 10 in testing that involves a single fuel injector 50 such that has two actuators, each operated by a respective driver circuit of an IDM 52. In addition, FIG. 2 shows an aspect of tool 10 that involves all injectors and their driver circuits, although detail of the other injectors and their driver circuits does not appear in FIG. 2.

Figure 3A:
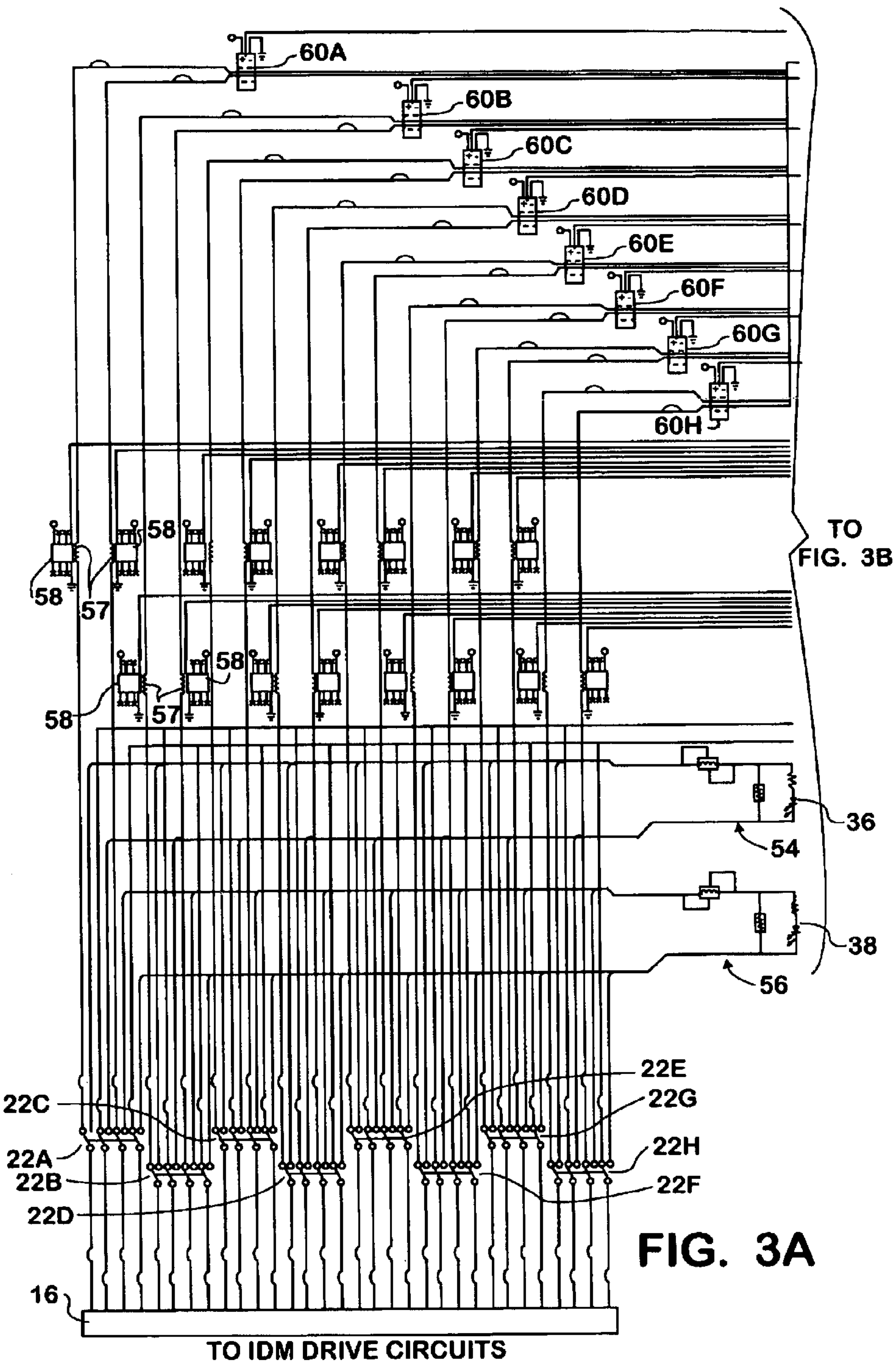
FIGS. 3A and 3B, taken together, illustrate a detailed schematic diagram of the tool.
Figure 3B:
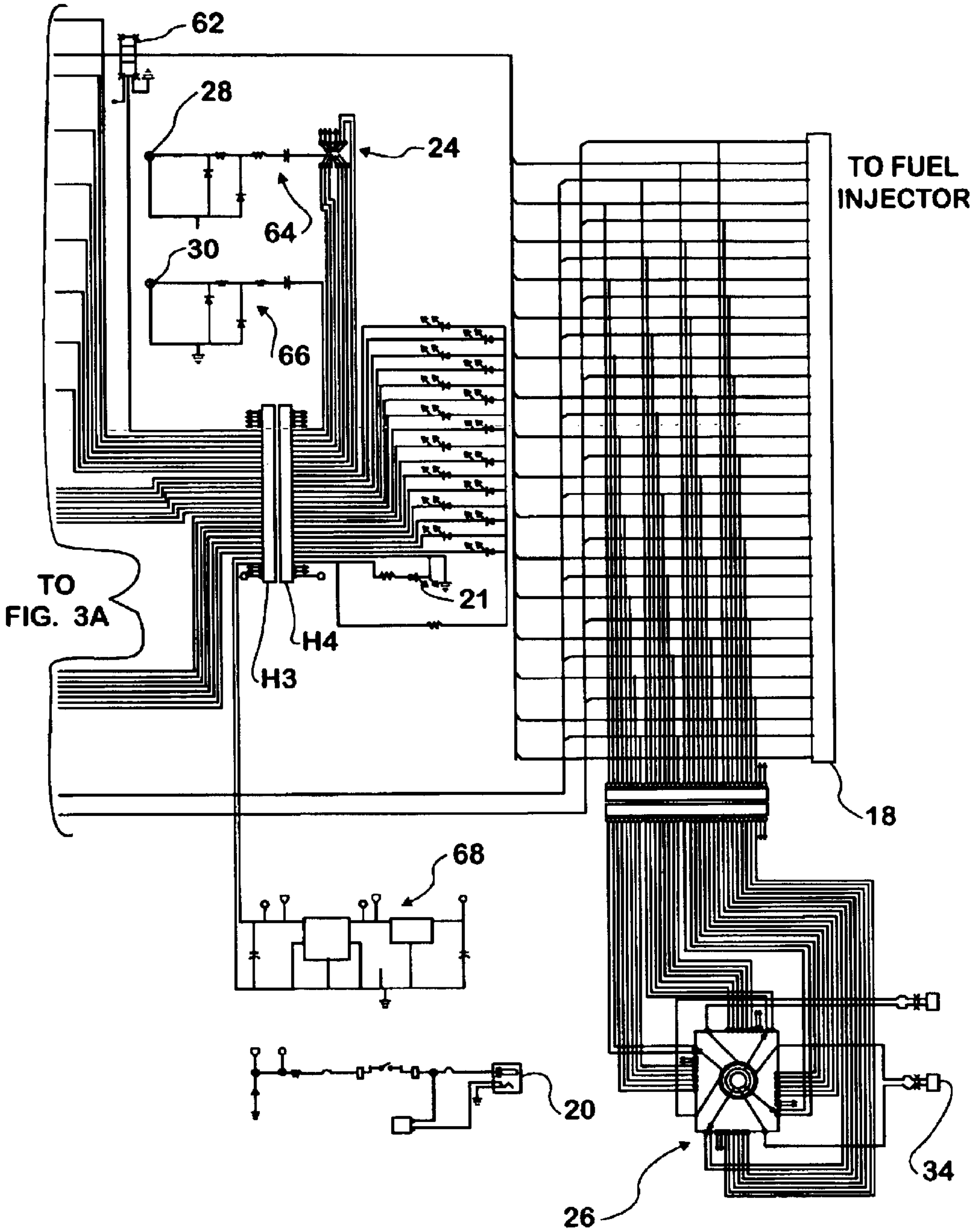

Housed within the interior of casing 12 are two electrical loads 54, 56, each simulating the load that a respective one of the two actuators of each fuel injector imposes on its respective driver circuit in IDM 52. It is understood that the fuel injectors are all alike in this example, as are the driver circuits for the corresponding actuators of all fuel injectors. FIGS. 3A and 3B show that simulated load 54 will be electrically connected as a load on a respective driver circuit in IDM 52, and simulated load 56 as a load on the respective driver circuit in IDM 52, whenever the particular position selector switch 22 associated with those two driver circuits and the corresponding fuel injector is switched from the position shown to a position designated "IDM Test". FIG. 3 also shows that LED 36 parallels an equivalent resistance portion of simulated load 54 and LED 38 parallels a corresponding portion of simulated load 56 so that each LED will illuminate when the respective simulated load is energized by the respective driver circuit. The other portion of each simulated load comprises an equivalent inductance.

When a particular position selector switch 22 is switched to a position designated "ON", that's the position shown for all switches 22 in FIG. 3A, one circuit is completed through the tool to one actuator of the corresponding fuel injector from the corresponding driver circuit for that one actuator, and another circuit is completed through the tool to the other actuator of the same fuel injector from the corresponding driver circuit for that other actuator. For these fuel injectors, the actuators comprise electromagnetic coils.

Figure 4:
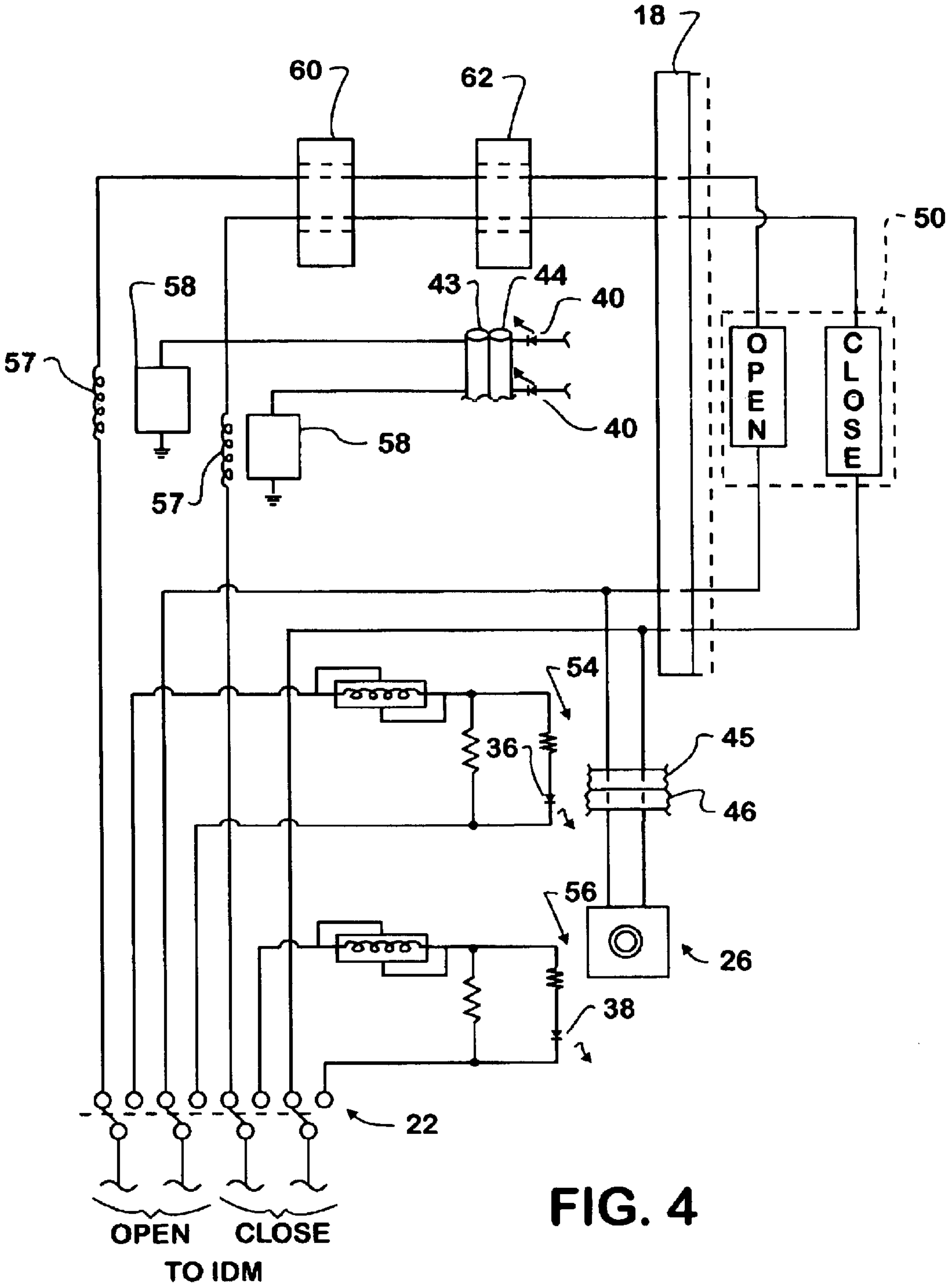
FIG. 4 illustrates a detailed schematic diagram showing, on a scale larger than that of FIGS. 3A and 3B, circuitry of the tool that is associated with one of the fuel injectors.

FIG. 4 illustrates those circuits for a representative switch 22 shown in ON position. Two contacts of switch 22 in the one circuit are connecting an OPEN coil of a fuel injector 50 to one driver circuit in IDM 52 for that coil; two other contacts of switch 22 in the other circuit are connecting a CLOSE coil of the fuel injector to another driver circuit in the IDM for that other coil. A respective sensor 58 senses magnetic flux created by flow of electric current from each respective driver circuit through the tool to the respective actuator. A respective LED 40 is associated with a respective sensor 58 as shown in FIGS. 3A and 3B. The sensors 58 are suffixed in the same way as the LED's are, making correlation of each sensor with an LED readily apparent. The LED's 40 that illuminate when driver circuits for the OPEN coils are energized illuminate with a color, green for example, that is different from the color, red for example, with which the LED's 40 associated with driver circuits for the CLOSE coils do when the latter driver circuits are energized. For correspondence, LED 36 may illuminate green, and LED 38, red.

Each sensor 58 comprises an electronic circuit chip disposed proximate at least one turn of a conductor of the current path from the driver circuit to the fuel injector. That arrangement effectively amplifies the density of magnetic flux that results from the flow of electric current through the current path. The chip operates the respective LED chip to illuminate the LED when the magnetic flux acting on the sensor exceeds an amount that indicates a particular electric current flow from the driver circuit to the fuel injector. An example of a chip that is suitable for sensor 58 is a digital magnetic field sensor available from Nonvolatile Electronics, Inc., Eden Prairie, Minn., as part number AD004-02. One terminal of each sensor 58 is connected to ground, another to a DC power supply within the tool, and a third to a respective one of LED's 40. When sufficient magnetic flux is sensed by a sensor 58, it grounds the respective LED 40 connected to it, illuminating the LED. The conductor need have only one or two turns 57 for association with the respective sensor 58 so that the amount of inductance introduced into the circuit between a driver circuit and the corresponding injector actuator is small and has minimal effect on the circuit.

A different type of sensor 60 senses flow of electric current from each driver circuit through the tool to a respective fuel injector actuator. Sensors 60 are electromagnetic. Each sensor 60 is connected to a respective terminal of switch 24, allowing each sensor to be selectively connected to port 28. Port 28 is constructed to accept a connector from an oscilloscope (not shown). In this way when an oscilloscope is connected to port 28, it can display the trace of the electric current waveform that is being delivered to each fuel injector.

An example of a sensor suitable for use as a sensor 60 is a solid state linear current sensor available from Honeywell, Inc., Sensing and Control, Freeport, Ill., as part number CSLA1CD. The sensor comprises a toroid that has an air gap. Wires that carry current to be sensed, the wires to the OPEN and CLOSED coils in this instance, are run through the open center of the toroid. The sensor has one terminal that is connected to ground, a second terminal connected to the positive terminal of a DC power supply within the tool, and a third terminal that outputs a respective signal that is supplied as an input to a respective terminal of switch 24. When switch 24 selects a particular one of the fuel injectors, the respective sensor 60 is connected through a filter circuit 64 to port 28. The filter circuit filters high-frequency noise and allows the oscilloscope connected to port 28 to display traces of the currents supplied to the open and close coils of the respective fuel injector from the respective driver circuits.

Another sensor 62, that can be one like sensors 60, is able to sense flow of electric current from all driver circuits through the tool to the fuel injector actuators. It will however sense current for a particular fuel injector only if the corresponding position selector switch 22 is in its "ON" position. Port 30 is also constructed to accept a connector from an oscilloscope so that when an oscilloscope is connected to port 30, it will display the trace of each electric current waveform that the respective switch 22 is allowing to be delivered to the respective fuel injector. The signal from sensor 62 is passed through a noise filter 66 for filtering high-frequency noise before being delivered to an oscilloscope connected to port 30.

Selector switch 26 is connected between injector-connection port 18 and the auxiliary-equipment-connection ports 32, 34. It is operable to select a particular one of the fuel injectors for direct connection to the auxiliary-equipment-connection ports 32, 34. When selecting a particular fuel injector, it connects the terminals of one actuator with respective terminals of port 32 and the terminals of the actuator with respective terminals of port 34. Each port 32, 34 is constructed to accepted terminals of a volt-ohmmeter (not shown). This enables the resistance of each actuator coil to be measured when the ohmmeter is connected to the respective port.

The internal power supplies within the tool, reference numeral 68 generally, provide stable DC voltages for the sensors and the various LED's. Power is obtained from the power source connected to jack 20 and stable voltages of 12VDC and 5VDC are provided internally of the tool by the internal power supplies.

The tool is capable of performing a driver circuit test, a fuel injector test, a driver-injector test, and a cylinder contribution test.

The driver circuit test for a particular fuel injector involves operating the respective position selector switch 22 to "IDM Test" position, thereby disconnecting the two driver circuits from the respective fuel injector and connecting them to the simulated loads 54, 56. The IDM is operated and the result of the test observed on LED's 36, 38. Illumination of the LED's indicates that the drivers are delivering current. The switches 22 are spring biased away from the "IDM Test" position and must be manually held in that position for this test. FIG. 1 shows the operators of switches 22A, 22F, and 22G having been pushed up to their ON positions where they will stay until pushed down, while those of the others remain in the center OFF position. The IDM Test position of a switch is not shown, but would occur when any of the switch operators is pushed down from the center OFF position and held there.

The fuel injector test is performed in conjunction with a volt-ohmmeter, connected with the tool at ports 32, 34 in the manner already described, and involves operating the respective position selector switch 22 to "OFF" position. This enables switch 26 to select a fuel injector whose actuator resistances are indicated by the volt-ohmmeter readings.

The driver-injector test is performed by operating respective switches 22 to "ON" position. Waveforms can be observed on an oscilloscope connected as described earlier, and LED's 40 can provide visual indication of current flow.

The cylinder contribution test is performed in the following manner. With the engine running and all switches 22 on, each switch 22 may be turned off while the others remain on to see if any change in engine running is noticed. When all cylinders are operating, the act of turning off one switch 22 should create a noticeable change in engine running, such as a change in engine noise, in addition to turning off the corresponding LED's 40 for that cylinder. Failure to notice a change in engine operation when one switch 22 is switched off may be an indication that the corresponding cylinder is not operating. If all switches 22 are on with the engine running, but an LED 40 for a particular cylinder is not lighting, occurrence of a noticeable change in engine operation when the corresponding switch 22 is turned off indicates that the LED may be defective.

Firing order table 42 serves to correlate each switch 22 with the correct cylinder in each of several different engine models, three models in the example of FIG. 1, a V-8 diesel engine, a V-6 diesel engine, and an I-6 diesel engine. Each cylinder in a particular engine model is assigned its own cylinder number, and that number obviously applies to the corresponding fuel injector. Each switch in the tool is designated by a particular suffix, A–H. When the tool is connected to one of those engine models by a corresponding set of jumper harnesses, table 42 shows which fuel injector is being controlled by which switch 22.

Because of the manner of fabricating the particular tool 10 with switches 24 and 26 and LED's 21 and 40 assembled to the front face of casing 12 and ports 28, 30, 32, 34 at the sides, multiple-pin connectors H4, H6 connect those components to mating connectors H3, H5 within the tool, as shown.

While a presently preferred embodiment of the invention has been illustrated and described, it should be appreciated that principles of the invention are applicable to all embodiments that fall within the scope of the following claims.

What is claimed is:

1. A diagnostic tool for testing fuel injectors and their driver circuits in a fuel injection system of an engine in a motor vehicle, the tool comprising:

a driver-connection port for connection to the driver circuits;

an injector-connection port for connection to the fuel injectors;

a load that simulates a load imposed by a fuel injector on a driver circuit;

individual position selector switches each of which is individual to a particular fuel injector and the respective driver circuit and is selectively operable to:

a) a first position that connects the simulated load through the driver-connection port to the respective driver circuit when the driver circuits have been disconnected in the vehicle from the fuel injectors and instead connected to the driver-connection port; and b) a second position that connects the respective driver circuit through the tool with the respective fuel injector when the driver circuits and the fuel injectors have been disconnected in the vehicle from each other, the driver circuits are instead connected to the driver-connection port, and the fuel injectors are instead connected to the injector-connection port.

2. A diagnostic tool as set forth in claim 1 wherein each position selector switch is further operable to a third position that disconnects the respective driver circuit from both the simulated load and the respective fuel injector when the driver circuits and the fuel injectors have been disconnected in the vehicle from each other, the driver circuits are connected to the driver-connection port, and the fuel injectors are connected to the injector-connection port.

3. A diagnostic tool as set forth in claim 1 further including an indicator that illuminates when the simulated load is being energized by a driver circuit.

4. A diagnostic tool as set forth in claim 3 wherein the simulated load comprises two individual simulated loads per fuel injector, each of which individual simulated loads is connected to a respective driver circuit when the driver circuits are connected to the driver-connection port and the respective position selector switch is in its first position, and the indicator comprises a respective indicator light that illuminates when the respective individual simulated load is being energized by the respective driver circuit.

5. A diagnostic tool as set forth in claim 1 further including, for each fuel injector, a respective sensor for sensing magnetic flux created by flow of electric current from a respective driver circuit through the tool to the respective fuel injector when the respective position selector switch is in the second position, and a respective indicator that illuminates when the magnetic flux sensed by the respective sensor is indicative of the delivery of a particular electric current from the respective driver circuit to the respective fuel injector.

6. A diagnostic tool as set forth in claim 5 including an auxiliary-equipment-connection port for connecting auxiliary test equipment to the tool, an injector-selector switch that is operable to select a particular one of the fuel injectors, and for each fuel injector, a respective sensor through which a signal indicative of flow of electric current through the tool to the respective fuel injector from the respective driver circuit is conveyed to the auxiliary-equipment-connection port when the injector-selector switch is selecting that particular fuel injector and the respective position selector switch is in the second position.

7. A diagnostic tool as set forth in claim 6 including an additional auxiliary-equipment-connection port for connecting auxiliary test equipment to the tool, and a sensor for delivering to the additional auxiliary-equipment-connection port, a signal indicative of flow of electric current through the tool to a fuel injector from the respective driver circuit when the respective position selector switch is in the second position.

8. A diagnostic tool as set forth in claim 1 including an auxiliary-equipment-connection port for connecting auxiliary test equipment to the tool, and an injector-selector switch that is connected between the injector-connection port and the auxiliary-equipment-connection port and that is operable to select a particular one of the injectors for direct connection to the auxiliary-equipment-connection port.

9. A diagnostic tool as set forth in claim 8 wherein the auxiliary-equipment-connection port comprises first and second terminals, and the injector-selector switch, when selecting a particular fuel injector, electrically connects a respective terminal of the selected fuel injector directly to a respective one of the first and second terminals of the auxiliary-equipment-connection port.

10. A diagnostic tool as set forth in claim 9 including an additional auxiliary-equipment-connection port that comprises its own first and second terminals, and wherein the injector-selector switch, when selecting a particular fuel injector, electrically connects a respective one of four terminals of the selected fuel injector directly to a respective one of the four terminals of the auxiliary-equipment-connection ports.

11. A diagnostic tool for testing a fuel injector and a respective driver circuit in a fuel injection system of an engine in a motor vehicle when the driver circuit and the fuel injector have been disconnected from each other in the vehicle and instead connected to the tool, the tool comprising:

a driver-connection port for connection of the driver circuit to the tool;

an injector-connection port for connection of the fuel injector to the tool;

an electric current path through the tool for conducting electric current from the driver circuit to the fuel injector;

a sensor for sensing magnetic flux created by flow of electric current through the current path; and an indicator that illuminates when the magnetic flux sensed by the sensor is indicative of the delivery of a particular electric current from the driver circuit to the fuel injector;

wherein the sensor comprises an electronic circuit chip disposed proximate at least one turn of a conductor of the current path that effectively amplifies the density of magnetic flux that results from the flow of electric current through the current path, and the indicator comprises a light-emitting diode that is operated by the chip to illuminate when the magnetic flux acting on the sensor exceeds an amount that indicates the particular electric current flow from the driver circuit to the fuel injector.

12. A diagnostic tool for testing fuel injectors and driver circuits that operate the fuel injectors in a fuel injection system of an engine in a motor vehicle when the driver circuits and the fuel injectors have been disconnected from each other in the vehicle and instead connected to the tool, the tool comprising:

a driver-connection port for connection of the driver circuits to the tool;

an injector-connection port for connection of the fuel injectors to the tool;

a respective electromagnetic sensor for sensing flow of electric current from each driver circuit through the tool to a respective fuel injector;

a first auxiliary-equipment-connection port for connecting an oscilloscope to the tool;

an injector-selector switch for selectively connecting the electromagnetic sensors to the first auxiliary-equipment-connection port;

a second auxiliary-equipment-connection port for connecting an oscilloscope to the tool; and an electromagnetic sensor connected to the second auxiliary-equipment-connection port for sensing flow of electric currents from multiple ones of the driver circuits to their respective fuel injectors.

13. A diagnostic tool as set forth in claim 12 wherein the electromagnetic sensor connected to the second auxiliary-equipment-connection port is disposed to sense flow of electric currents from all of the driver circuits to their respective fuel injectors.

14. A diagnostic tool as set forth in claim 12 including a position selector switch for selectively connecting and disconnecting each driver circuit to and from the respective fuel injector.

15. A diagnostic tool for testing of fuel injectors and their driver circuits in a fuel injection system of an engine in a motor vehicle when the driver circuits and the fuel injectors have been disconnected from each other in the vehicle and instead connected to the tool, the tool comprising:

a driver-connection port for connection of the driver circuits to the tool;

an injector-connection port for connection of the fuel injectors to the tool;

switches that allow the driver circuits to be individually selectively connected and disconnected, through the tool, to and from the fuel injectors.

16. A diagnostic tool as set forth in claim 15 including an indicator that is associated with an actuator of each fuel injector and that illuminates when the respective driver circuit is delivering current to the associated actuator.

17. A diagnostic tool as set forth in claim 15 including a firing order table for correlating the tool with any one of multiple engine models comprising indicia correlating each switch with the correct cylinder in each particular engine model.

18. A diagnostic tool for testing fuel injectors and their driver circuits in a fuel injection system of an engine in a motor vehicle when the driver circuits and the fuel injectors have been disconnected from each other in the vehicle and instead connected to the tool, the tool comprising:

a driver-connection port for connection of the driver circuits to the tool;

an injector-connection port for connection of the fuel injectors to the tool;

auxiliary-equipment-connection ports that allow connection of auxiliary test equipment to the tool;

a load that simulates the load imposed by a fuel injector on a driver circuit;

multiple indicators;

switches that allow the driver circuits to be selectively connected and disconnected, through the tool, to and from the fuel injectors, and that a) when disconnecting a driver circuit from a respective fuel injector, connect that driver circuit to the simulated load to enable a driver circuit test to be performed with the result being indicated by one of the indicators, b) when disconnecting a driver circuit from a respective fuel injector, connect a fuel injector to one of the auxiliary-equipment-connection ports to enable a fuel injector test to be performed via a piece of test equipment connected to that one auxiliary-equipment-connection ports; and c) when connecting a driver circuit to a respective fuel injector, enable a driver-injector test to be performed with the result being indicated by a respective indicator, and with a waveform of electric current flow from the driver circuit to the fuel injector being made available to another piece of test equipment connected to another of the auxiliary-equipment-connection ports.

19. A method for conducting diagnostic testing of fuel injectors and their driver circuits in a fuel injection system of an engine in a motor vehicle, the method comprising:

disconnecting mated connections between the driver circuits and the fuel injectors;

connecting the driver circuits to a driver-connection port of the tool;

connecting the fuel injectors to an injector-connection port of the tool;

conducting at least one of the following tests comprising:

a) a fuel injector test, by connecting a piece of test equipment that measures an electrical characteristic of an electric actuator of a fuel injector to an auxiliary-equipment-connection port of the tool, and operating switches of the tool to disconnect the actuator of the fuel injector from the respective driver circuit and to instead connect the actuator to the auxiliary-equipment-connection port;

b) a driver-injector test, by connecting an oscilloscope to an additional auxiliary-equipment-connection port of the tool, and operating the switches of the tool to connect the fuel injector actuator to the respective driver circuit and to connect to the additional auxiliary-equipment-connection port, a sensor that senses the electric current flow from the respective driver circuit to the fuel injector actuator;

c) a driver circuit test, by operating the switches of the tool to disconnect the actuator of the fuel injector from the respective driver circuit and to instead connect the respective driver circuit to a load that simulates the load imposed by the respective fuel injector; and d) a cylinder contribution test, by operating the switches of the tool to connect each fuel injector actuator to its respective driver circuit, and then selectively operating the switches to selectively disconnect certain fuel injector actuators from their driver circuits while leaving the remaining fuel injector actuators connected to their driver circuits.

20. A method as set forth in claim 19 wherein the fuel injector test, the driver-injector test, and the driver circuit test are all performed.

21. A method as set forth in claim 19 wherein the fuel injector test comprises connecting a volt-ohmmeter as the piece of test equipment that measures an electrical characteristic of an electric actuator of a fuel injector to the auxiliary-equipment-connection port.

* * * * *